(12) United States Patent
Peters et al.

(10) Patent No.: US 11,733,497 B2
(45) Date of Patent: Aug. 22, 2023

(54) ATHERMALIZED INFRARED TELEPHOTO CAMERA LENS FOR TRACKING CAMERAS

(71) Applicant: BAE SYSTEMS Information and Electronic Systems Integration Inc., Nashua, NH (US)

(72) Inventors: Kevin W. Peters, Merrimack, NH (US); Gerard J. Pelletier, Amherst, NH (US); David E. Thompson, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 120 days.

(21) Appl. No.: 17/538,467

(22) Filed: Nov. 30, 2021

(65) Prior Publication Data

US 2023/0168474 A1 Jun. 1, 2023

(51) Int. Cl.
*G02B 13/14* (2006.01)
*H01L 27/146* (2006.01)
*G02B 13/02* (2006.01)

(52) U.S. Cl.
CPC ............ *G02B 13/14* (2013.01); *G02B 13/02* (2013.01); *H01L 27/14627* (2013.01); *H01L 27/14649* (2013.01)

(58) Field of Classification Search
CPC ... G02B 13/14; G02B 13/02; H01L 27/14627; H01L 27/14649
See application file for complete search history.

(56) References Cited

U.S. PATENT DOCUMENTS

| | | | |
|---|---|---|---|
| 5,434,617 | A | 7/1995 | Bianchi |
| 9,946,053 | B1 | 4/2018 | Fry et al. |
| 2012/0147483 | A1 | 6/2012 | Oskotsky et al. |
| 2019/0017886 | A1 | 1/2019 | Pollard et al. |
| 2020/0116979 | A1 | 4/2020 | Kathman et al. |

FOREIGN PATENT DOCUMENTS

EP 26B7889 A1 1/2014

OTHER PUBLICATIONS

International Search Report, PCT/US22/49788, dated Feb. 27, 2023, 21 pages.

*Primary Examiner* — Jared Walker
(74) *Attorney, Agent, or Firm* — Maine Cernota & Rardin

(57) ABSTRACT

An athermalized Short-Wave InfraRed (SWIR) telephoto lens for a tracking camera having, in order, from a remote object to an image plane an aperture stop, a first optical element having a first element first surface radius of 23.21 mm, a first element second surface radius of 46.25 mm, a second optical element having a second element first surface radius of 22.72 mm, a second element second surface radius of 45.58 mm, a third optical element having a third element first surface radius of −56.85 mm, a third element second surface radius of 16.65 mm, where the lens is corrected over a spectral waveband of 1.5 μm to 1.6 μm from −10 C to +65 C, has a length from the first element to the camera of 88 mm, has a telephoto ratio of 0.367, has an F# of 24, and has a focal length of 240 mm.

20 Claims, 24 Drawing Sheets

3-ELEMENT LENS

MRTD TARGET

200

SILICON REFRACTIVE INDEX CHANGE WITH TEMPERATURE

300

THERMAL POWERS FOR SOME COMMON IR MATERIALS

INFRARED MATERIALS DISPERSION CHART

3-ELEMENT LENS

3-ELEMENT LENS CROSS SECTION

LENS RMS DATA

-10 DEG. C LENS OPTICAL PATH DIFFERENCE DATA

18 DEG. C LENS OPTICAL PATH DIFFERENCE DATA

65 DEG. C LENS OPTICAL PATH DIFFERENCE DATA

1100

TANGENTIAL RAY DIAGRAM
FIELD = -0.9170 DEG.

FIELD = 0.0 DEG.

FIELD = 0.6482 DEG.

SAGITTAL RAY DIAGRAM
FIELD = -0.9170 DEG.

FIELD = 0.0 DEG.

FIELD = 0.6482 DEG.

-10 DEG. C LENS RAY DATA

18 DEG. C LENS RAY DATA

65 DEG. C LENS RAY DATA

```
GENERAL LENS DATA:

Surfaces                           :                    10
Stop                               :                     1
System Aperture                    : Entrance Pupil Diameter =    10
Fast Semi-Diameters                : On
Field Unpolarized                  : On
Convert thin film phase to ray equivalent :   On
J/E Conversion Method              : X Axis Reference
Glass Catalogs                     : SCHOTT PATENTS_SWIR
Ray Aiming                         : Off
Apodization                        : Uniform, factor =    0.00000E+00
Reference OPD                      : Exit Pupil
Paraxial Rays Setting              : Ignore Coordinate Breaks
Method to Compute F/#              : Tracing Rays
Method to Compute Huygens Integral : Auto
Print Coordinate Breaks            : On
Multi-Threading                    : On
OPD Modulo 2 Pi                    : Off
Temperature (C)                    :     1.80000E+01
Pressure (ATM)                     :     8.50000E-02
Adjust Index Data To Environment   : On
Effective Focal Length             :        241.2294    (in air at system temp. & press.)
Effective Focal Length             :        241.2294    (in image space)
Back Focal Length                  :          2.15699
Total Track                        :        303.9997
Image Space F/#                    :         24.12294
Paraxial Working F/#               :         24.12294
Working F/#                        :         24.17493
Image Space NA                     :          0.02072271
Object Space NA                    :          5e-10
Stop Radius                        :          5
Paraxial Image Height              :          3.861126
Paraxial Magnification             :          0
Entrance Pupil Diameter            :         10
Entrance Pupil Position            :          0
Exit Pupil Diameter                :          3.467251
Exit Pupil Position                :        -83.37072
Field Type                         : Angle in degrees
Maximum Radial Field               :          0.917
Primary Wavelength [μm]            :          1.6
Angular Magnification              :          2.887729
Lens Units                         : Millimeters
Source Units                       : Watts
Analysis Units                     : Watts/cm^2
Afocal Mode Units                  : milliradians
MTF Units                          : cycles/millimeter
Include Calculated Data in Session File :   On
Include Calculated Data in Session File :   On
```

PRESCRIPTION
FIG. 14A

```
Fields          : 3
Field Type      : Angle in degrees
#       X-Value         Y-Value         Weight
1       0.000000        0.000000        1.000000
2       0.000000        0.917000        1.000000
3       0.000000        -0.917000       1.000000

Vignetting Factors
#       VDX     VDY     VCX     VCY     VAN
1       0.000000    0.000000    0.000000    0.000000    0.000000
2       0.000000    0.000000    0.000000    0.000000    0.000000
3       0.000000    0.000000    0.000000    0.000000    0.000000

Wavelengths     : 3
Units: µm
#       Value           Weight
1       1.600000        1.000000
2       1.500000        1.000000
3       1.550000        1.000000

Predicted coordinate ABCD matrix:
A =             240.5
B =             0
C =             0
D =             240.8

SURFACE DATA SUMMARY:

Surf    Type        Radius      Thickness   Glass   Clear Diam.  Chip Zone  Mech Diam  Conic  Comment
OBJ     STANDARD    Infinity    Infinity            0            0          0          0
STO     STANDARD    Infinity    216                 0            0          0          0      stop
 2      STANDARD    23.20877    6.4         ZNS     20           0          20         0
 3      STANDARD    46.25187    6.5                 18           0          20         0
 4      STANDARD    22.72226    6.5         ZNS     20           0          20         0
 5      STANDARD    45.57776    2.2728              14           0          20         0
 6      STANDARD    -56.85377   6.5         SI      20           0          20         0
 7      STANDARD    16.65206    56.36192            14           0          20         0
 8      STANDARD    Infinity    1.559978    N-BK7   20           0          20         0
 9      STANDARD    Infinity    1.985               20           0          20         0
IMA     STANDARD    Infinity                        .913795      0          7.913795   0
```

PRESCRIPTION
FIG. 14B

```
SURFACE DATA DETAIL:
Surface OBJ STANDARD
Surface STO STANDARD stop
Surface   2 STANDARD
Aperture                  : Floating Aperture
Maximum Radius            :             10

Surface   3 STANDARD
Aperture                  : Floating Aperture
Maximum Radius            :              9

Surface   4 STANDARD
Aperture                  : Floating Aperture
Maximum Radius            :             10

Surface   5 STANDARD
Aperture                  : Floating Aperture
Maximum Radius            :              7

Surface   6 STANDARD
Aperture                  : Floating Aperture
Maximum Radius            :             10

Surface   7 STANDARD
Aperture                  : Floating Aperture
Maximum Radius            :              7

Surface   8 STANDARD
Tilt/Decenter             :      Decenter X   Decenter Y   Tilt X   Tilt Y   Tilt Z        Order
Before surface            :               0            0      3.5        0        0 Decenter, Tilt
After surface             :              -0           -0     -3.5       -0       -0 Tilt, Decenter
Aperture                  : Floating Aperture
Maximum Radius            :             10

Surface   9 STANDARD
Aperture                  : Floating Aperture
Maximum Radius            :             10
```

PRESCRIPTION
FIG. 14C

```
MULTI-CONFIGURATION DATA:              Surface IMA STANDARD
Configuration   1:
  1 Temperature     :           18      EDGE THICKNESS DATA:
  2 Pressure        :        0.085
  3 Thickness   1   :          216      Surf         X-Edge          Y-Edge
  4 Curvature   2   :   0.04308716       STD      218.264868      218.264868
  5 Thickness   2   :          6.4         2        5.019222        5.019222
  6 Glass       2   :              ZNS     3        7.934712        7.934712
  7 Semi-diam   2   :           10         4        4.721949        4.721949
  8 Chip Zone   2   :            0         5        0.845691        0.845691
  9 Mech-SDia   2   :           10         6        8.929114        8.929114
 10 Curvature   3   :   0.02162075         7       54.819165       54.819165
 11 Thickness   3   :          6.5         8        1.559978        1.559978
 12 Semi-diam   3   :            9         9        1.905000        1.905000
 13 Chip Zone   3   :            0       IMA        0.000000        0.000000
 14 Mech-SDia   3   :           10
 15 Curvature   4   :    0.0440097
 16 Thickness   4   :          6.5
 17 Glass       4   :              ZNS
 18 Semi-diam   4   :           10
 19 Chip Zone   4   :            0
 20 Mech-SDia   4   :           10
 21 Curvature   5   :   0.02194052
 22 Thickness   5   :       2.2728
 23 Semi-diam   5   :            7
 24 Chip Zone   5   :            0
 25 Mech-SDia   5   :           10
 26 Curvature   6   :  -0.01758898
 27 Thickness   6   :          6.5
 28 Glass       6   :              SI
 29 Semi-diam   6   :           10
 30 Chip Zone   6   :            0
 31 Mech-SDia   6   :           10
 32 Curvature   7   :   0.06005264
 33 Thickness   7   :      56.36192
 34 Semi-diam   7   :            7
 35 Chip Zone   7   :            0
 36 Mech-SDia   7   :           10
 37 Curvature   8   :            0
 38 Thickness   8   :     1.559978
 39 Glass       8   :              N-BK7
 40 Semi-diam   8   :           10
 41 Chip Zone   8   :            0
 42 Mech-SDia   8   :           10
 43 Curvature   9   :            0
 44 Thickness   9   :        1.905
 45 Semi-diam   9   :           10
 46 Chip Zone   9   :            0
 47 Mech-SDia   9   :           10
```

PRESCRIPTION
FIG. 14D

```
SOLVE AND VARIABLE DATA:
Semi Diameter      1    : Fixed
Semi Diameter      2    : Fixed
Mech Semi Diameter 2    : Fixed
Semi Diameter      3    : Fixed
Mech Semi Diameter 3    : Fixed
Semi Diameter      4    : Fixed
Mech Semi Diameter 4    : Fixed
Semi Diameter      5    : Fixed
Mech Semi Diameter 5    : Fixed
Semi Diameter      6    : Fixed
Mech Semi Diameter 6    : Fixed
Semi Diameter      7    : Fixed
Mech Semi Diameter 7    : Fixed
Semi Diameter      8    : Fixed
Mech Semi Diameter 8    : Fixed
Semi Diameter      9    : Fixed
Mech Semi Diameter 9    : Fixed INDEX OF REFRACTION DATA:
System Temperature:  18.0000 Celsius
System Pressure   :   0.0850 Atmospheres
Absolute air index:   1.000023 at wavelength 1.600000 µm
Index data is relative to air at the system temp. & press.
Wavelengths are measured in air at the system temp. & press.

Surf Glass Temp   Pres   1.60000000     1.50000000     1.55000000
  0         18.00  0.09  1.0000000000   1.0000000000   1.0000000000
  1         18.00  0.09  1.0000000000   1.0000000000   1.0000000000
  2   ZNS   18.00  0.09  2.2708408168   2.2728402185   2.2718404017
  3         18.00  0.09  1.0000000000   1.0000000000   1.0000000000
  4   ZNS   18.00  0.09  2.2708408168   2.2728402185   2.2718404017
  5         18.00  0.09  1.0000000000   1.0000000000   1.0000000000
  6   SI    18.00  0.09  3.4727478374   3.4809746567   3.4766648989
  7         18.00  0.09  1.0000000000   1.0000000000   1.0000000000
  8   N-BK7 18.00  0.09  1.5003923538   1.5016456565   1.5010236573   step 0.5 avail.
  9         18.00  0.09  1.0000000000   1.0000000000   1.0000000000
 10         18.00  0.09  1.0000000000   1.0000000000   1.0000000000
```

PRESCRIPTION
FIG. 14E

```
THERMAL COEFFICIENT OF EXPANSION DATA:

Surf                    Glass         TCE * 10E-6
  0                                   0.0000000000
  1                                   0.0000000000
  2                     ZNS           6.7500000000
  3                                   0.0000000000
  4                     ZNS           6.7500000000
  5                                   0.0000000000
  6                     SI            2.5000000000
  7                                   0.0000000000
  8                     N-BK7         7.1000000000    step 0.5 avail.
  9                                   0.0000000000
 10                                   0.0000000000
```

PRESCRIPTION
FIG. 14F

GLOBAL VERTEX COORDINATES, ORIENTATIONS, AND ROTATION/OFFSET MATRICES:
Reference Surface: 1

| Surf | R11<br>R21<br>R31 | R12<br>R22<br>R32 | R13<br>R23<br>R33 | X<br>Y<br>Z | Tilt X<br>Tilt Y<br>Tilt Z | |
|---|---|---|---|---|---|---|
| 1 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>0.000000000E+00 | 0.000000000E+00<br>0.000000000E+00<br>0.000000000E+00 | stop |
| 2 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.160000000E+02 | 0.000000000E+00<br>0.000000000E+00<br>0.000000000E+00 | |
| 3 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.224000000E+02 | 0.000000000E+00<br>0.000000000E+00<br>0.000000000E+00 | |
| 4 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.289000000E+02 | 0.000000000E+00<br>0.000000000E+00<br>0.000000000E+00 | |
| 5 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.354000000E+02 | 0.000000000E+00<br>0.000000000E+00<br>0.000000000E+00 | |
| 6 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.376727999E+02 | 0.000000000E+00<br>0.000000000E+00<br>0.000000000E+00 | |
| 7 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>2.441727999E+02 | 0.000000000E+00<br>0.000000000E+00<br>0.000000000E+00 | |
| 8 | 1.0000000000<br>0.0000000000<br>0.0000000000 | 0.0000000000<br>0.9981347984<br>0.0610485395 | 0.0000000000<br>-0.0610485395<br>0.9981347984 | 0.000000000E+00<br>0.000000000E+00<br>3.005347199E+02 | 3.500000000E+00<br>0.000000000E+00<br>0.000000000E+00 | |
| 9 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>3.020946977E+02 | 0.000000000E+00<br>0.000000000E+00<br>0.000000000E+00 | |
| 10 | 1.0000000000<br>0.0000000000<br>0.0000000000 | 0.0000000000<br>1.0000000000<br>0.0000000000 | 0.0000000000<br>0.0000000000<br>1.0000000000 | 0.000000000E+00<br>0.000000000E+00<br>3.039996977E+02 | 0.000000000E+00<br>0.000000000E+00<br>0.000000000E+00 | |

PRESCRIPTION
FIG. 14G

```
GLOBAL SURFACE CENTER OF CURVATURE POINTS:
Reference Surface: 1
Surf            X                   Y                   Z
 1              -                   -                   -              stop
 2         0.0000000000        0.0000000000      239.2087723012
 3         0.0000000000        0.0000000000      268.6518655914
 4         0.0000000000        0.0000000000      251.6222632453
 5         0.0000000000        0.0000000000      280.9777646919
 6         0.0000000000        0.0000000000      180.8190341392
 7         0.0000000000        0.0000000000      260.8248566082
 8              -                   -                   -
 9              -                   -                   -
10              -                   -                   -
```

ELEMENT VOLUME DATA:
For centered elements with plane or spherical circular faces, exact
volumes are computed by assuming edges are squared up to the larger
of the front and back radial aperture.

For all other elements, approximate volumes are numerically integrated
to 0.1% accuracy. Zero volume means the volume cannot be accurately computed.

Single elements that are duplicated in the Lens Data Editor
for ray tracing purposes may be listed more than once yielding
incorrect total mass estimates.

```
                            Volume cc       Density g/cc    Mass g
Element surf   2 to 3       1.825834        4.090000        7.467662
Element surf   4 to 5       1.812505        4.090000        7.413145
Element surf   6 to 7       2.544003        2.329000        5.927080
Element surf   8 to 9       0.490216        2.510000        1.230442
Total Mass:                                                22.038329
```

F/# DATA:
F/# calculations consider vignetting factors and ignore surface apertures.

```
Wavelength:         1.600000              1.500000              1.550000
 #    Field         Tan       Sag         Tan       Sag         Tan       Sag
 1    0.0000 (deg): 24.1843   24.1655     23.9541   23.9355     24.0404   24.0217
 2    0.9170 (deg): 24.2223   24.2625     23.9382   24.0160     24.0507   24.1099
 3   -0.9170 (deg): 24.1077   24.2624     23.8249   24.0159     23.9369   24.1099
```

PRESCRIPTION
FIG. 14H

```
CARDINAL POINTS:

Object space positions are measured with respect to surface 1.
Image space positions are measured with respect to the image surface.
The index in both the object space and image space is considered.

Object Space            Image Space
W =      1.600000  (Primary)
Focal Length           :            -241.229394             241.229394
Focal Planes           :            -696.605141               0.251990
Principal Planes       :            -455.375747            -240.977404
Anti-Principal Planes  :            -937.834536             241.481385
Nodal Planes           :            -455.375747            -240.977404
Anti-Nodal Planes      :            -937.834536             241.481385

W =      1.500000
Focal Length           :            -239.234407             239.234407
Focal Planes           :            -690.890052              -0.391083
Principal Planes       :            -451.655645            -239.625490
Anti-Principal Planes  :            -930.124459             238.843324
Nodal Planes           :            -451.655645            -239.625490
Anti-Nodal Planes      :            -930.124459             238.843324

W =      1.550000
Focal Length           :            -239.947421             239.947421
Focal Planes           :            -692.620680              -0.141527
Principal Planes       :            -452.673259            -240.088948
Anti-Principal Planes  :            -932.568101             239.805894
Nodal Planes           :            -452.673259            -240.088948
Anti-Nodal Planes      :            -932.568101             239.805894
```

PRESCRIPTION
FIG. 14I

```
PHYSICAL OPTICS PROPAGATION SETTINGS SUMMARY:

OBJ STANDARD
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
 STO STANDARD                stop
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
   2 STANDARD
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
   3 STANDARD
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
   4 STANDARD
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
   5 STANDARD
Use Rays To Propagate To Next Surface   : Off
Recompute Pilot Beam                    : Off
Do Not Rescale Beam Size Using Ray Data : Off
Use Angular Spectrum Propagator         : Off
Use X-Axis Reference                    : Off
Output Pilot Radius                     : Best Fit
```

PRESCRIPTION
FIG. 14J

```
   6 STANDARD
Use Rays To Propagate To Next Surface  : Off
Recompute Pilot Beam                   : Off
Do Not Rescale Beam Size Using Ray Data: Off
Use Angular Spectrum Propagator        : Off
Use X-Axis Reference                   : Off
Output Pilot Radius                    : Best Fit
   7 STANDARD
Use Rays To Propagate To Next Surface  : Off
Recompute Pilot Beam                   : Off
Do Not Rescale Beam Size Using Ray Data: Off
Use Angular Spectrum Propagator        : Off
Use X-Axis Reference                   : Off
Output Pilot Radius                    : Best Fit
   8 STANDARD
Use Rays To Propagate To Next Surface  : Off
Recompute Pilot Beam                   : Off
Do Not Rescale Beam Size Using Ray Data: Off
Use Angular Spectrum Propagator        : Off
Use X-Axis Reference                   : Off
Output Pilot Radius                    : Best Fit
   9 STANDARD
Use Rays To Propagate To Next Surface  : Off
Recompute Pilot Beam                   : Off
Do Not Rescale Beam Size Using Ray Data: Off
Use Angular Spectrum Propagator        : Off
Use X-Axis Reference                   : Off
Output Pilot Radius                    : Best Fit
  IMA STANDARD
Use Rays To Propagate To Next Surface  : Off
Recompute Pilot Beam                   : Off
Do Not Rescale Beam Size Using Ray Data: Off
Use Angular Spectrum Propagator        : Off
Use X-Axis Reference                   : Off
```

PRESCRIPTION
FIG. 14K

ATHERMALIZED INFRARED TELEPHOTO CAMERA LENS FOR TRACKING CAMERAS

STATEMENT OF GOVERNMENT INTEREST

This invention was made with government support under a Classified Contract number awarded by a Classified Agency. The government has certain rights in the invention.

FIELD

The following disclosure relates, in general, to an infrared lens system and, more specifically, to athermalized lenses in the short wave infrared that fit into an extremely compact space and maintain performance over a large temperature range.

BACKGROUND

The infrared lens objective is one of the most important subsystems of a remote sensing system. Its function is to collect the maximum amount of radiated energy from the target scene and project the image of the scene onto the system focal plane. It also establishes the critical sensor system performance parameters of target resolution, field of view, image quality, and image rectilinearity.

In general, Infrared (IR) optical system design has a number of considerations and tradeoffs that make the process and configuration more complex. These include image spot size versus focal plane pixel size and pitch, transmittance and thermal performance of infrared lens objective materials, vignetting by lens elements and cold shield efficiency.

These considerations are in addition to the overall goals of maximizing system resolving-power, maintaining good area coverage, maximizing light collection, and minimizing system size, cost, and weight.

Athermalized IR telephoto lenses are widely used in airborne imaging sensors designed for high resolution and wide wavelength range imaging applications such as reconnaissance, surveillance, and mapping. For these applications, the lens must meet strict optical requirements over the wavelength range of about 1 micrometers to about 3 micrometers, the Short-Wave InfraRed (SWIR) band. Athermalized IR telephoto lenses typically utilize a number of materials to provide the necessary optical performance. The application of a high performance athermalized IR telephoto lens allows for a sensor system with reduced Size, Weight, Power and Cost (SWaP-C). The lens objective must also provide high transmittance, high resolution, low distortion, and a flat image. The telephoto lens may also be used for laser tracking systems. In this case, the lens assembly may require an external pupil that is a large distance from the lens assembly.

For IR imaging systems, which detect the thermal radiation from objects, an important measure of performance is the ability to detect small changes in temperature, called thermal resolution. The smallest temperature difference a system can distinguish from the background noise (and therefore can display) is called the thermal resolution. Temperature changes smaller than the thermal resolution will not be detected. Often thermal resolution is described by NETD, which stands for Noise-Equivalent-Temperature-Difference. NETD is the temperature difference in which the signal power detected is equal to the noise-equivalent-power (NEP).

The thermal resolution (or NETD) can be improved by increasing the size of the detecting elements, since more flux will be collected by each element. Unfortunately, this degrades the spatial resolution, by increasing the Instantaneous Field Of View (IFOV). As a general result (which is not proven here) the thermal and spatial resolution may be inversely proportional.

Since it is not possible to simultaneously achieve high spatial and thermal resolution, neither is a good measure of the overall IR imaging system performance. A single quantity, called the Minimum Resolvable Temperature Difference (MRTD), measures both performance factors simultaneously. MRTD is determined experimentally and therefore takes into account all of the various contributing factors. Measurement of MRTD is done by slowly heating a test pattern at some range from the detector.

FIG. 1 (Prior Art) depicts a typical test pattern 100. The spacing from one bar to another is a single cycle of the test pattern. For a spacing of d millimeters, the spatial frequency is 1/d with units of cycles/millimeter. Since the spatial extent is related to the IFOV by the range, the spatial frequency can be expressed as cycles/milliradian calculated from 1000/(R d).

MRTD is the temperature difference at which bars of a particular frequency first become visible against the background. MRTD has units of degrees C. at a given spatial frequency (in cycles/milliradian). MRTD combines both spatial and thermal resolution into a single quantity that can be used to compare systems.

Athermalized IR telephoto lenses designed for high resolution imaging applications such as reconnaissance, surveillance, and mapping are often deployed in airborne platforms. For a broad applicability of airborne platforms, the lens must be able to perform over a wide environmental temperature range (athermalized). To meet the critical sensor system performance parameters of target resolution and image quality, the lens must specifically be able to maintain focus over the specified environmental temperature range, such as −10 C to +65 C. Focus changes with temperature can be quite large, reducing the tolerable environmental temperature range of an optical system.

For example, considering the simple case of a single element thin lens, the change in focal length of the lens with temperature is given by:

$$\Delta f = -\gamma f \Delta T = -\left(\frac{dn/dT}{n-1} - \alpha_L\right) f \Delta T$$

Where:
$\gamma$=thermo-optical coefficient of the lens
dn/dT=refractive index change with temperature
n=refractive index of the lens
$\alpha_L$=Thermal Expansion Coefficient (TCE) of the lens
f=focal length of the lens
$\Delta T$=temperature change Further considering the simple case of this lens housing, the expansion of the housing with temperature is given by:

$$\Delta L = \alpha_H L \Delta T$$

Where
$\alpha_H$=Thermal Coefficient of Expansion (TCE) of the housing
L=length of the housing In the case of most IR materials, r is positive and indicates a negative change in focal length with increasing temperature, while the housing expands, giving the total amount of defocus as:

$$\Delta z = \Delta L - \Delta f$$

From aberration theory, the depth of focus for a diffraction limited imaging system ($\lambda/4$) is given by:

$$\Delta z = \pm 2\lambda (F/\#)^2$$

Where
F/#=f/D (focal length/clear aperture diameter)
Combining the above gives the tolerable temperature change for a single element thin lens:

$$\Delta T = \pm \frac{2\lambda(F/\#)}{D(\alpha_H + \gamma)}$$

As it is often not possible to hold the IR system within tolerable temperature limits, some method that compensates for the change in focus with temperature must be employed. This is known as athermalization and the choice of technique ultimately depends on the application for which the IR system is to be used. The techniques for athermalization fall into three main categories:
1. Electro-mechanically active
2. Mechanically passive
3. Optically passive Each option must be appropriately weighed with respect to the cost, performance, etc. for the system under consideration. Many systems incorporating these techniques have been designed, built, and tested.

Electro-mechanical active athermalization relies on lens elements being moved in a controlled manner by electro-mechanical devices using information from separate temperature sensors or image quality metrics. This requires a complex servo-mechanism design and is most suitable in optical systems such as zoom lenses in which an electro-mechanical focus mechanism already exists. The main advantages of this method are they can cope with thermal gradients through the system, easily cope with non-linear effects, and there is no thermal inertia (temperature sensors can be placed at the compensator elements). Disadvantages of this technique of athermalization are decreased reliability, increased size, weight, power, complexity and cost (SWAP-C^2).

Mechanical passive athermalization essentially involves some method of moving a lens element or elements through the thermal expansion of the lens structure material by an amount that compensates for thermal defocus. A large number of materials can be utilized as spacers or structural elements, with a correspondingly wide range of expansion coefficients. Some choices in structure materials are given in the Coefficients of Thermal Expansion (CTE) for most common Opto-mechanical materials in Table 1 below:

TABLE 1

| Material | CTE (×10–6K–1) |
|---|---|
| Aluminum | 23.6 |
| Invar | 0.5 to 2.0 |
| 1025 Steel | 12.0 |
| AlBeMet | 13 |

By using two different materials with very different thermal expansions arranged as either differential expansion cylinders or rods, it is possible to move the compensating element directly. The rods or cylinders must be of sufficient length to give the required differential movement.

Consider combining spacers of length $L_1$ and $L_2$ of materials with thermal coefficients of expansion $\alpha_1$ and $\alpha_2$ respectively, then to athermalize over a distance L requires that:

$$\alpha_1 L_1 + \alpha_2 L_2 = 0$$

$$L_1 + L_2 = L$$

Using materials with $\alpha > 0$ requires L<0, that is:

$$\alpha_1 L_1 - \alpha_2 L_2 = 0$$

$$L_1 - L_2 = L$$

To achieve passive mechanical athermalization housing materials and lengths are carefully chosen to compensate for thermal focus shift.

Optically passive athermalization eliminates the thermally induced defocus in the system by combining suitably chosen lens materials that together compensate for thermal focus shift. Typical IR lens materials properties are shown in Table 2 below.

TABLE 2

| | Refractive Index | | CTE | dn/dT | Knoop Hardness | Spectral |
|---|---|---|---|---|---|---|
| Material | @4 | @10µ | (ppm/K) | (ppm/K) | (g/mm2) | Range |
| Germanium | 4.0243 | 4.0032 | 6 | 396 | 800 | 2.0-17.0 µm |
| Silicon | 3.4255 | N/A | 2.7 | 150 | 1150 | 1.2-9.0 µm |
| ZnS (Cleartran) | 2.2523 | 2.2008 | 4.6 | 54 | 230 | 0.37-14.0 µm |
| ZnSe | 2.4331 | 2.4065 | 7.1 | 60 | 105 | 0.55-20.0 µm |
| Magnesium Fluoride | 1.3526 | N/A | 8 | 20 | 415 | 0.11-7.5 µm |
| Sapphire | 1.6753 | N/A | 5.6 | 13.7 | 1370 | 0.17-5.5 µm |
| Gallium Arsenide | 3.3069 | 3.2778 | 5.7 | 148 | 721 | 0.9-16.0 µm |
| $CaF_2$ | 1.4097 | 1.3002 | 18.9 | −11 | 170 | 0.13-10.0 µm |
| $BaF_2$ | 1.458 | 1.4014 | 18.4 | −15 | 82 | 0.15-12.5 µm |

If the lens undergoes a change in temperature, its material properties can vary greatly, causing a significant change in its optical property of index of refraction with respect to temperature, referred to as dn/dt. The dn/dt changes the optical power and focusing ability of the lens. Example dn/dt values for silicon and germanium are given in FIGS. 3 and 4.

FIG. 2 (Prior Art) depicts the silicon refractive index change 200 with temperature. As depicted, the index of refraction increases with temperature.

When a lens undergoes a change in temperature, its physical dimensions can also change. The characterization of this amount of dimensional change with thermal change is referred to as the material's Coefficient of Thermal Expansion (CTE). The CTE effects also cause a change in the optical power and focusing ability of the lens. CTE and dn/dt of the materials in a lens are the leading causes of focus shifts in imaging systems. In most cases, these effects can be mitigated through the athermalization techniques noted previously.

The combined effects of dn/dt and CTE can be characterized by the thermal power of the lens. The thermal power of the lens is given by:

Thermal power:

$$\gamma = \frac{1}{(n_{ref}-1)} \frac{\partial n}{\partial T} - \alpha$$

$\partial n/\partial T$ is the change of index with respect to temperature, $n_{ref}$ is the index of refraction at the reference temperature, and a is the linear coefficient of thermal expansion.

FIG. 3 (Prior Art) is a chart 300 showing thermal powers for some common IR materials. As can be seen, thermal powers of lens materials can be negative or positive, so suitable combinations of materials and powers can be arranged so that a lens is passively optically athermalized.

In order for the IR objective lens to have good overall imaging performance, besides maintaining focus over its environmental temperature range, it must also maintain focus across its operating wavelength range as well. When a lens maintains good focus over its wavelength range it is considered achromatized. When not achromatized, the lens focus point for each wavelength is different along the optical axis. When achromatized, the shortest and longest wavelengths in the objective lens wavelength range come to a common focus and the lens is considered corrected for primary axial chromatic aberration. Glass types and lens optical powers are carefully selected to achieve primary axial color correction.

To achieve secondary color correction, the center wavelength of the IR objective lens wavelength range must also be designed to focus at the same point as the shortest and longest wavelengths. When this is achieved, the lens is considered corrected for secondary axial color. Secondary color correction is important, as it is often limits the imaging performance of high resolution lenses.

The contribution of individual optical elements to the total objective lens axial chromatic aberration is proportional to the square of axial marginal ray height at the element, its optical power and it is reciprocal of Abbe number of lens material.

The Abbe number $V_{\lambda 2}$ through the definite width of the spectrum is given by:

$$V_{\lambda 2}=(n_{\lambda 2}-1)/(n_{\lambda 1}-n_{\lambda 3})$$

where $n_{\lambda 2}$ is the index of refraction of the glass at the center wavelength $\lambda 2$ of the required spectrum, $n_{\lambda 1}$ is the index of refraction at shortest wavelength $\lambda 1$ of the spectrum and $n_{\lambda 3}$ is the index of refraction at the longest wavelength $\lambda 3$ of the spectrum.

The smaller the value of $V_{\lambda 2}$, the greater the chromatic dispersion of the glass.

Silicon's V-value is 250, and elements from silicon act as crown glass and have positive optical powers. Axial color correction is accomplished by matching different dispersions to the different optical powers. The lack of materials available in the SWIR wavelength range makes this task difficult, along with the generally inability to fabricate cemented achromatic doublets in the infrared.

FIG. 4 (Prior Art) is an infrared materials dispersion chart 400 showing the dispersion characteristics of various infrared materials across a broad frequency wavelength range of 1 to 12 microns.

Therefore, there exists a need in the art for an athermalized camera lens, a lens that is optothermally stable and whose optical properties do not change with variations in temperature, in the near and short wave infrared that fits into an extremely compact space while maintaining its performance from −10 C to +65 C, and more particularly, to an athermalized infrared telephoto camera lens for tracking cameras.

SUMMARY

An embodiment provides an athermalized Short-Wave InfraRed (SWIR) telephoto lens device for a tracking camera comprising, in order, from a remote object to an image plane an Aperture Stop (AS); a first optical element having a first element first surface radius of 23.16 to 23.24 mm convex, and a first element second surface radius of 46.21 to 46.29 mm concave; a second optical element having a second element first surface radius of 22.68 to 22.76 mm convex, and a second element second surface radius of 46.21 to 46.29 mm concave; and a third optical element having a third element first surface radius of −56.81 to −56.89 mm concave, and a third element second surface radius of 16.61 to 16.69 mm concave; and a housing to hold at least the first, second, and third optical elements comprising a material having a Coefficient of Thermal Expansion (CTE) of about 8.8 ppm/K at room temperature; whereby an image is formed. In embodiments, the lens is corrected over a spectral waveband of 1.5 μm to 1.6 μm from −10 C to +65 C. In other embodiments the a length from the first optical element to the camera is 88 mm. In subsequent embodiments the telephoto ratio is 0.367. For additional embodiments the full Field Of View (FOV) is 3 degrees. In another embodiment the F# is 24. For a following embodiment, the aperture stop is 8.50 inches from the first surface of the first optical element; the second surface of the first optical element is 0.850 inches from a reference point; the second surface of the second optical element is 0.3685 inches from the reference point; and the second surface of the third optical element is 0.090 inches from the reference point. Subsequent embodiments further comprise a window after the third optical element. Additional embodiments further comprise a flat window after the third optical element. Included embodiments further comprise a wedged window after the third optical element. In yet further embodiments the thickness of the first optical element is 6.4 mm; the thickness of the second optical element is 6.5 mm; and the thickness of the third optical element is 6.5 mm. In related embodiments a material of the first optical element is Zinc Sulfide. For further embodiments a material of the second optical element is Zinc Sulfide. In ensuing embodiments a material of the third optical element is Silicon.

Another embodiment provides an athermalized Short-Wave InfraRed (SWIR) telephoto lens system comprising, in order, from a remote object to an image plane an Aperture Stop (AS); a first optical element having a first element first surface radius of 23.20877 mm convex, and a first element second surface radius of 46.25187 mm concave; a second optical element having a second element first surface radius of 22.72226 mm convex, and a second element second surface radius of 45.57776 mm concave; and a third optical element having a third element first surface radius of −56.85377 mm concave, and a third element second surface radius of 16.65206 mm concave; and a housing to hold at least the first, second, and third optical elements comprising a material having a Coefficient of Thermal Expansion (CTE) of about 8.8 ppm/K at room temperature; whereby an image is formed. For yet further embodiments the lens system comprises a lens system of a tracking camera. For more embodiments the housing is comprised of titanium. Continued embodiments include that the housing is comprised of a nickel alloy. For additional embodiments the housing is comprised of stainless steel.

A yet further embodiment provides an athermalized Short-Wave InfraRed (SWIR) telephoto lens tracking camera comprising, in order, from a remote object to an image plane an Aperture Stop (AS); a first optical element having a first element first surface radius of 23.20877 mm convex, and a first element second surface radius of 46.25187 mm concave; a second optical element having a second element first surface radius of 22.72226 mm convex, and a second element second surface radius of 45.57776 mm concave; a third optical element having a third element first surface radius of −56.85377 mm concave, and a third element second surface radius of 16.65206 mm concave; a wedged window; wherein the second surface of the first optical element is 0.850 inches from a reference point; wherein the second surface of the second optical element is 0.3685 inches from the reference point; wherein the second surface of the third optical element is 0.090 inches from the reference point; wherein the second surface of the first optical element is 0.850 inches from a reference point; wherein the second surface of the second optical element is 0.3685 inches from the reference point; wherein the second surface of the third optical element is 0.090 inches from the reference point; wherein a material of the first optical element is Zinc Sulfide; wherein a material of the second optical element is Zinc Sulfide; wherein a material of the third optical element is Optical Silicon; a lens housing to hold at least the first, second, and third optical elements made of Titanium alloy Ti-6Al-4V having a Coefficient of Thermal Expansion (CTE) of about 8.8 ppm/K at room temperature; wherein the lens is corrected over a spectral waveband of 1.5 µm to 1.6 µm from −10 C to +65 C, a length from the first element to the camera is 88 mm, a telephoto ratio is 0.367, an F# is 24, and a focal length is 240 mm.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

BRIEF DESCRIPTION OF THE DRAWINGS

FIGS. 14A-14K present the Zemax® OpticStudio® lens prescription configured in accordance with an embodiment. Zemax® and OpticStudio® are registered trademarks of Zemax LLC of Redmond, Wash.

Implementations of the techniques discussed above may include a method or process, a system or apparatus, a kit, or computer software stored on a computer-accessible medium. The details or one or more implementations are set forth in the accompanying drawings and the description below. Other features will be apparent from the description and drawings, and form the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter. For purposes of clarity, not every component may be labeled in every drawing.

DETAILED DESCRIPTION

Embodiments comprise a three lens element design where the overall length of the lens assembly is less than the focal length (hence telephoto), with an external aperture stop that is 216 mm in front of the first element. Applications include an infrared telephoto camera lens and laser tracking telephoto lens. Embodiments maintain a diffraction limit over −10 C to +65 C. Embodiments of the three element design have a focal length of 240 mm and a length from the first element to the camera of 88 mm. This is an extreme telephoto ratio of 0.367 (compared to telephoto ratios of 0.8-0.9). As noted, for embodiments, the aperture stop is 216 mm (8.50 inches) in front of the first element.

TABLE 3

Specification for lens system embodiments is as follows:

| PARAMETER TYPE | PARAMETER VALUE |
|---|---|
| Effective Focal Length | 240 mm +/− 1% |
| Aperture Stop/Ent. Pupil Location | 216 mm prior to the first element |
| Spectral Band | 1.5 to 1.6 microns |
| Full Field of View | 3 degrees |
| Operational Temp. | −10 C. to +65 C. |

TABLE 3-continued

Specification for lens system embodiments is as follows:

| PARAMETER TYPE | PARAMETER VALUE |
|---|---|
| F/# | 24 |
| # of Elements | 3 |
| Element Materials | ZnS & Si |

Figure 1:
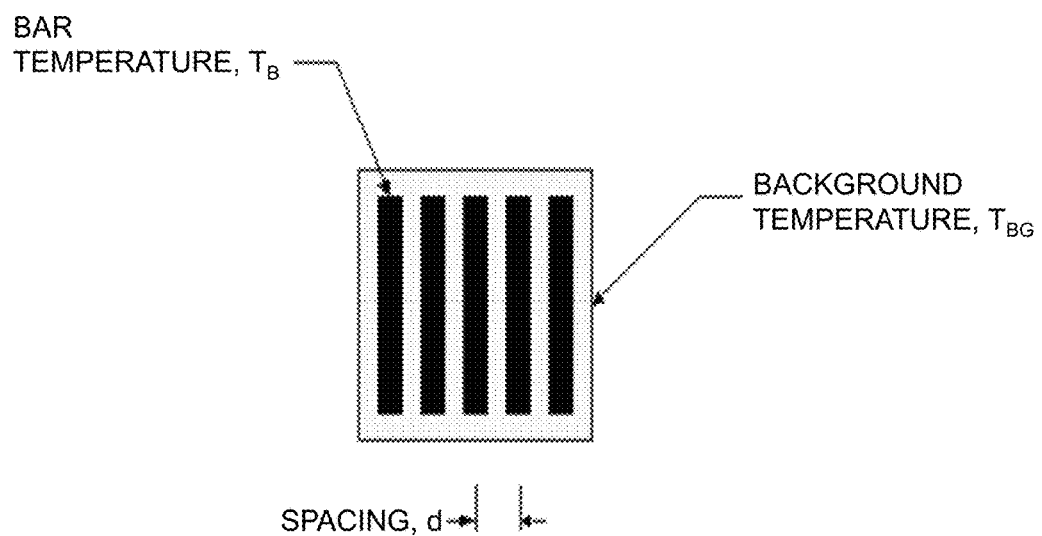
FIG. 1 (Prior Art) depicts an MRTD target test pattern.
Figure 2:
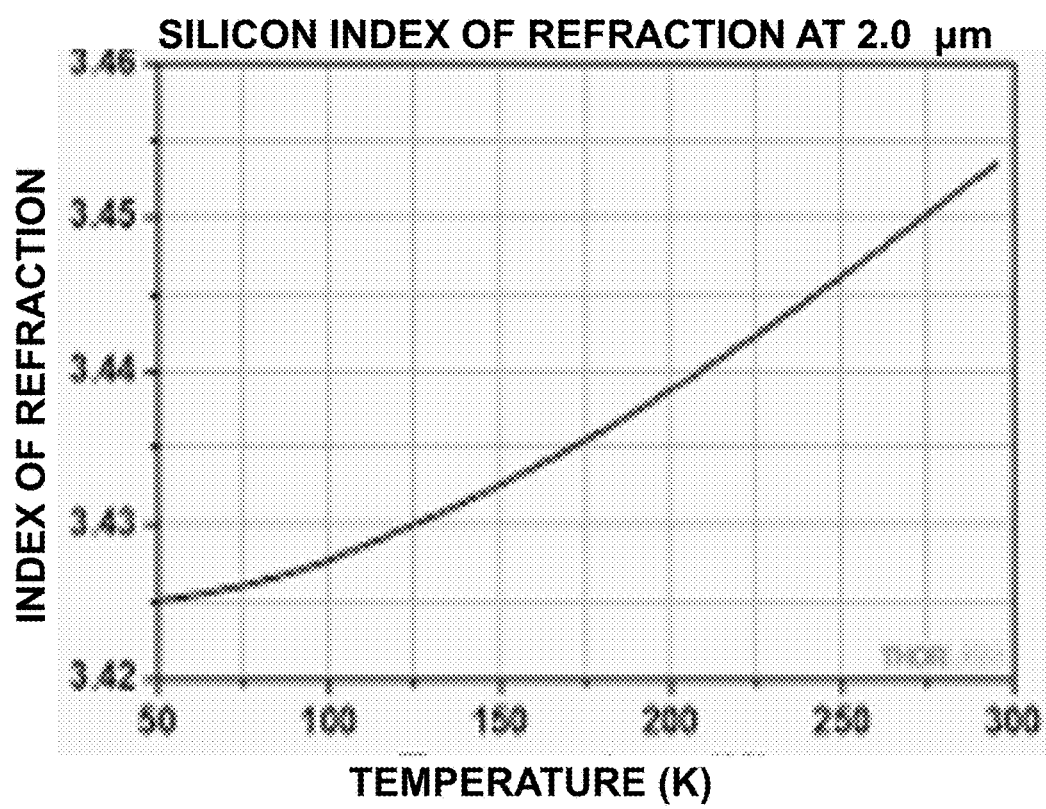
FIG. 2 (Prior Art) is a graph depicting Silicon refractive index change with temperature.
Figure 3:
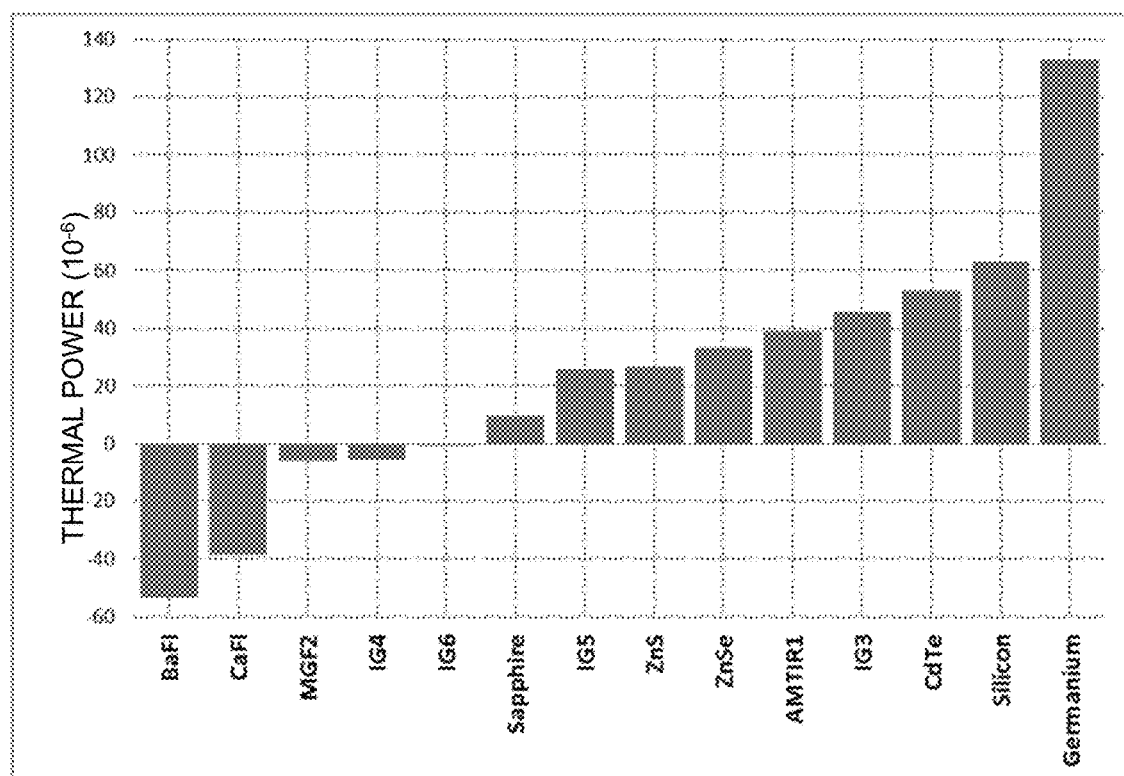
FIG. 3 (Prior Art) is a chart of thermal powers of IR lens materials.
Figure 4:
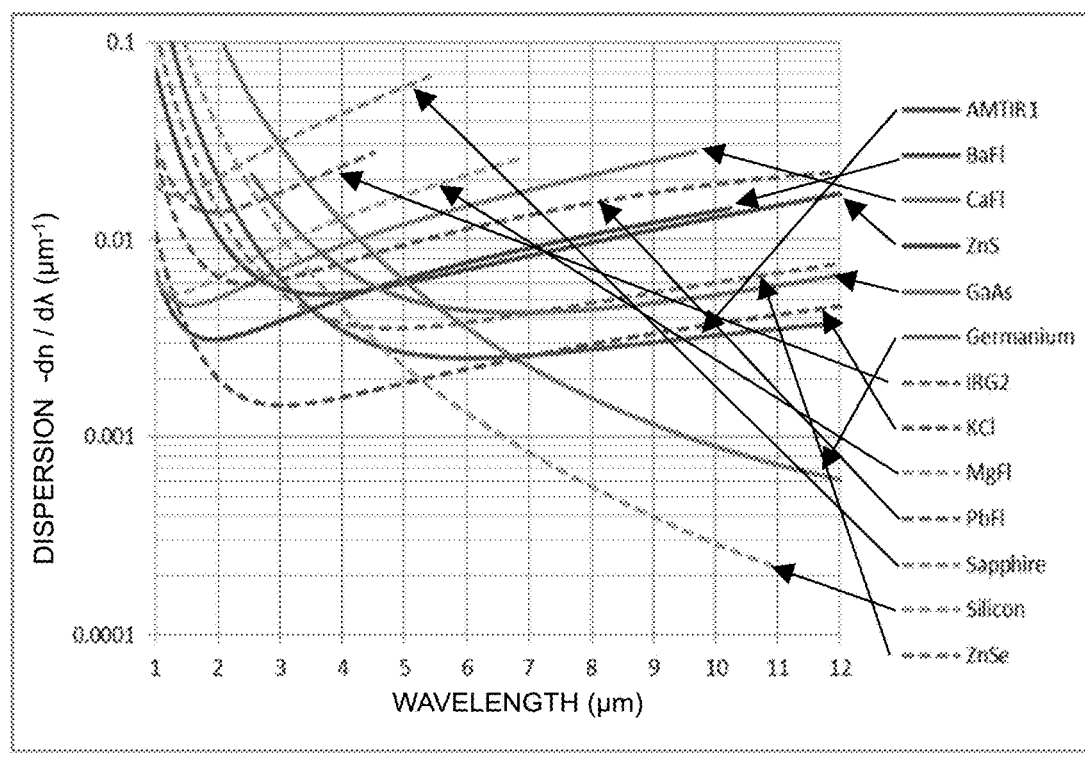
FIG. 4 (Prior Art) is a graph of Infrared materials dispersion.
Figure 5:
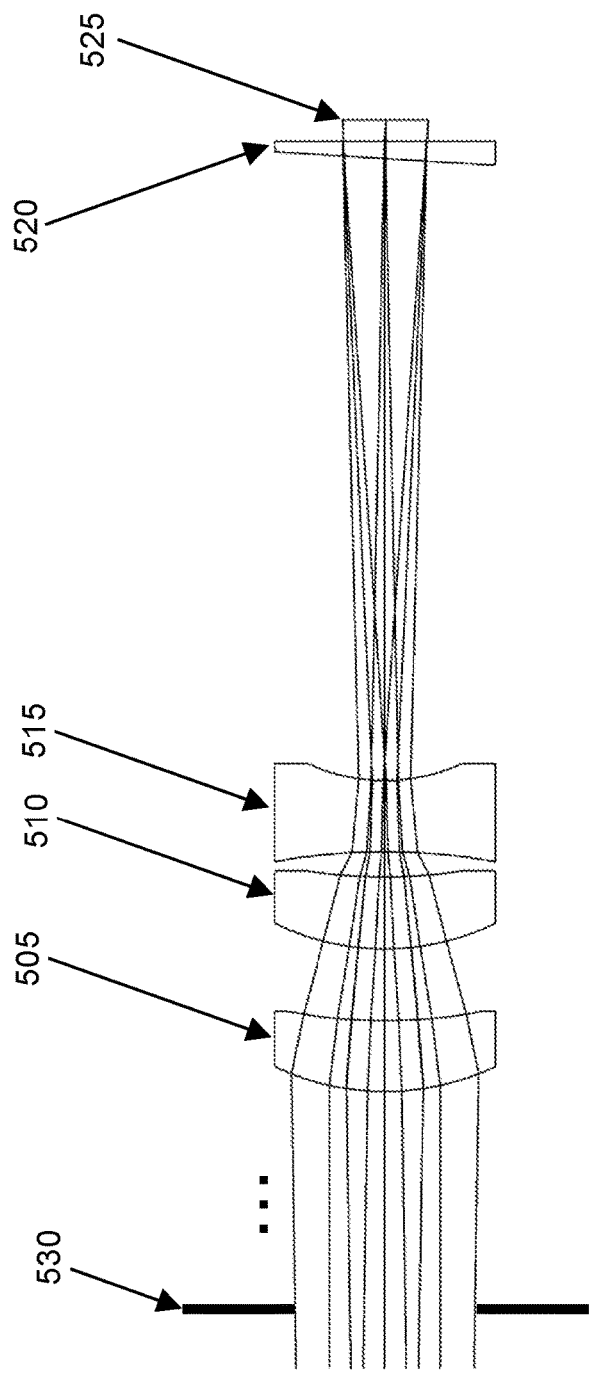
FIG. 5 shows a 3-element lens configured in accordance with an embodiment.

FIG. 5 shows a 3-element embodiment athermalized infrared telephoto lens for tracking cameras 500. The signal from the scene or image is represented by the series of bundled lines entering from the left and striking the first optical element 505. In embodiments, the lens system includes first optical element 505; second optical element 510; third optical element 515; and wedged window 520. The image of the remote target is formed on Focal Plane Array (FPA) 525 which constitutes an InGaAs FPA in embodiments. As mentioned, for embodiments, there is an aperture stop/entrance pupil 530 216 mm (8.50 inches) in front of the first surface of the first element. Aperture stop 530 location is depicted not-to-scale in this Figure. In this 3-element embodiment the first optical element 505 in one example is made from ZnS and has a thickness of 6.4 mm with a first element, first surface, convex radius in the range of 23.16 to 23.24, preferably 23.20877 mm, and a first element, second surface, concave radius in the range of 46.21 to 46.29, preferably 46.25187 mm. The second optical element 510 in one example is made from ZnS and has a thickness of 6.5 mm with a second element, first surface, convex radius in the range of 22.68 to 22.76, preferably 22.72226 mm, and a second element, second surface, concave radius in the range of 46.21 to 46.29, preferably 46.25187 mm. The third optical element 515 in one example is made from optical silicon and has a thickness of 6.5 mm with a third element, first surface, concave radius in the range of −56.81 to −56.89, preferably −56.85377 mm, and a third element, second surface, concave radius in the range of 16.61 to 16.69, preferably 16.65206 mm. The overall system 500 has a focal length of 240 mm, and a telephoto ratio of 0.367 compared to state of the art telephoto ratios of 0.8-0.9.

TABLE 4

Standard prescription terminology data for lens system embodiments is as follows:

| Surface | RADIUS | THICKNESS | MATERIAL |
|---|---|---|---|
| 0 | OBJECT | Infinity | Infinity |
| 1 | STOP | Infinity | 216 |
| 2 | 2 | 23.20877 | 6.4 | ZnS |
| 3 | 3 | 46.25187 | 6.5 |
| 4 | 4 | 22.72226 | 6.5 | ZnS |
| 5 | 5 | 45.57776 | 2.2728 |
| 6 | 6 | −56.85377 | 6.5 | Si |
| 7 | 7 | 16.65206 | 56.36192 |
| 8 | 8 | Infinity | 1.559978 | N-BK7 |
| 9 | 9 | Infinity | 1.905 |
| 10 | IMAGE | Infinity | — |

| Surface | CLEAR-DIAM | MECH-DIAM | CONIC |
|---|---|---|---|
| 0 | OBJECT | 0 | 0 | 0 |
| 1 | STOP | 0 | 0 | 0 |
| 2 | 2 | 20 | 20 | 0 |
| 3 | 3 | 18 | 20 | 0 |
| 4 | 4 | 20 | 20 | 0 |
| 5 | 5 | 14 | 20 | 0 |
| 6 | 6 | 20 | 20 | 0 |
| 7 | 7 | 14 | 20 | 0 |
| 8 | 8 | 20 | 20 | 0 |
| 9 | 9 | 20 | 20 | 0 |
| 10 | IMAGE | 7.903909 | 7.903909 | 0 |

Figure 6:
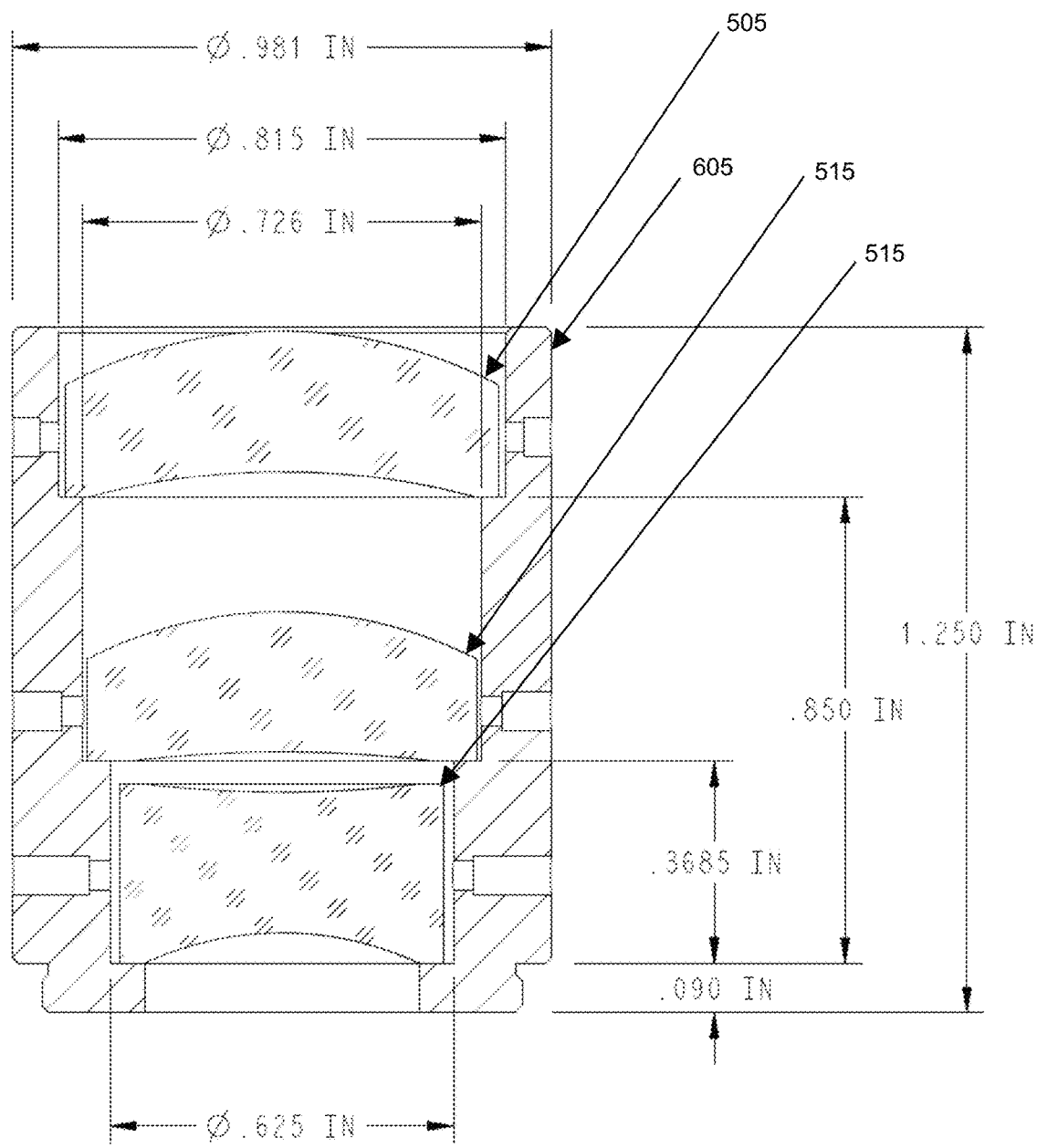
FIG. 6 shows a 3-element lens cross section in accordance with an embodiment.

FIG. 6 shows a 3-element lens system embodiment cross section 600 with housing mount dimensions in inches. The three lenses are held in housing 605 that includes recessed sections for each lens. In embodiments the section retaining first optical element 505 extends between 0.90 inch from a housing first end and is 0.3685 inch deep linearly with a diameter of 0.625 inch. The section retaining second optical element 510 extends 0.850 inch from the end of the first element recess with a diameter of 0.726 inch. The section retaining third optical element 515 extends from the end of the second element recess to the housing end opposite the housing first end with a diameter of 0.815 inch. For embodiments the housing overall length is 1.25 inches and the overall housing diameter is 0.981 inch.

Figure 7:
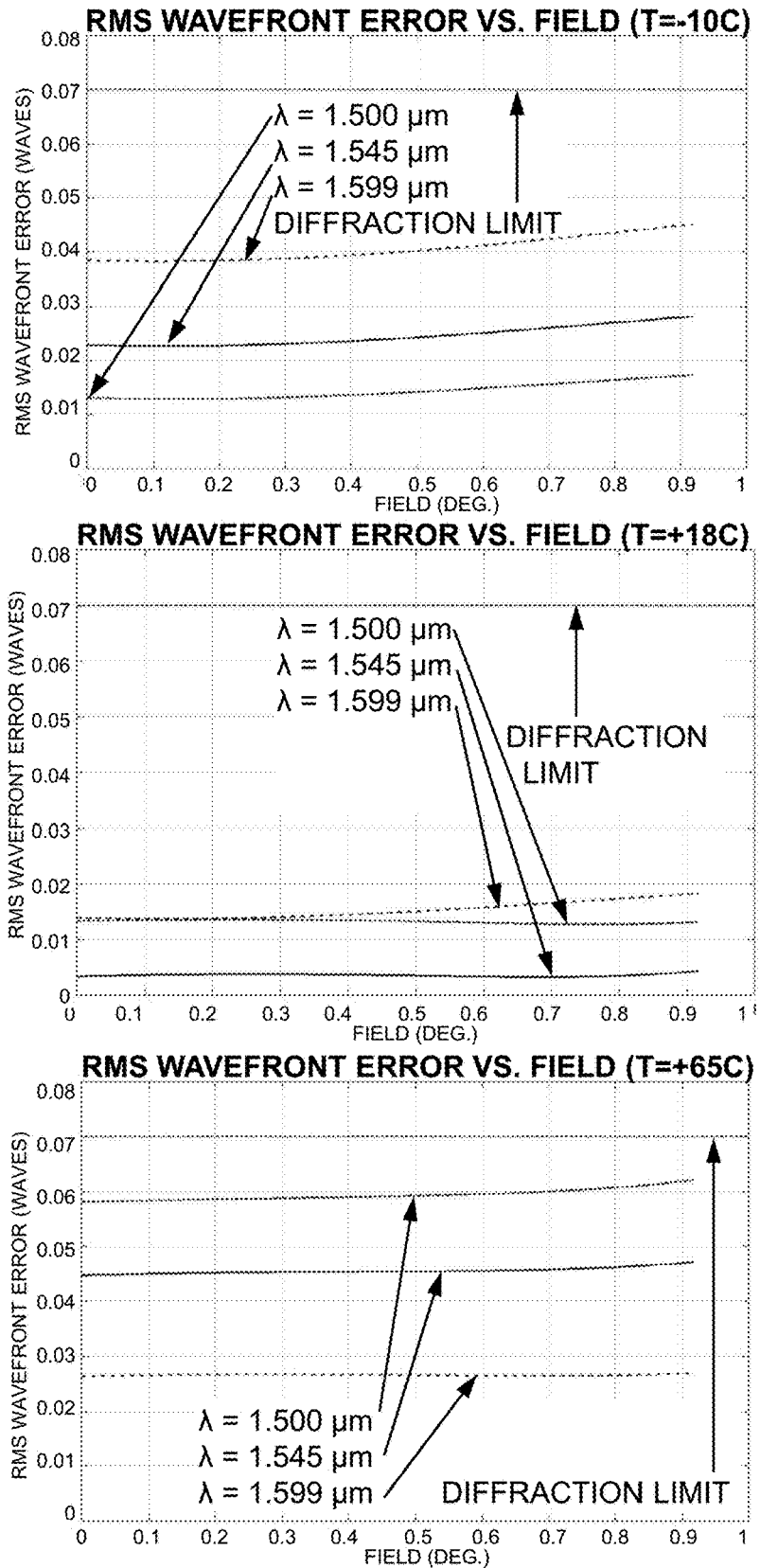
FIG. 7 shows RMS wavefront data configured in accordance with an embodiment.

FIG. 7 depicts RMS wavefront vs. the field angle performance graphs 700 for embodiments of the lens system. Values are for −10, +18, and +65 degrees C., and wavelength values of 1.500, 1.545, and 1.599 microns. The diffraction limit is 0.07 waves. At −10 C the RMS wavefront error is between 0.01 and 0.05 waves for the full field. At +18 C the RMS wavefront error is between 0.002 and 0.02 waves for the full field. At +65 C the RMS wavefront error is between 0.025 and 0.065 waves for the full field. Performance is diffraction limited across the field.

Figure 8:
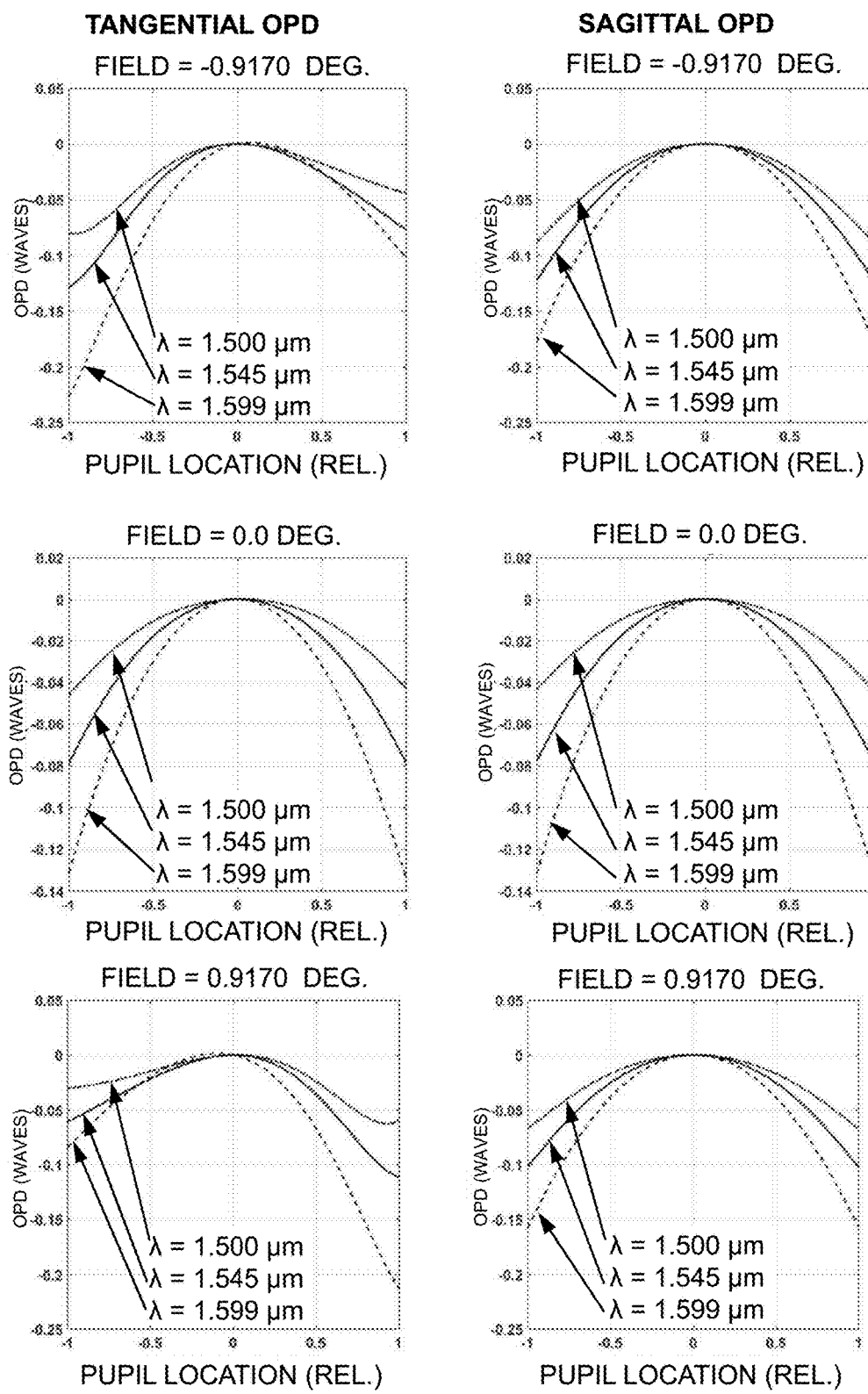
FIG. 8 shows lens optical path difference (OPD) data for −10 degrees C. configured in accordance with an embodiment.

FIG. 8 shows lens Optical Path Difference (OPD) performance data 800 for −10 degrees C. Values are for tangential and sagittal OPD for fields of −0.9170 degrees, 0.0 degrees, and +0.9170 degrees, wavelength values of 1.500, 1.545, and 1.599 microns at relative pupil locations of −1 to +1.

Figure 9:
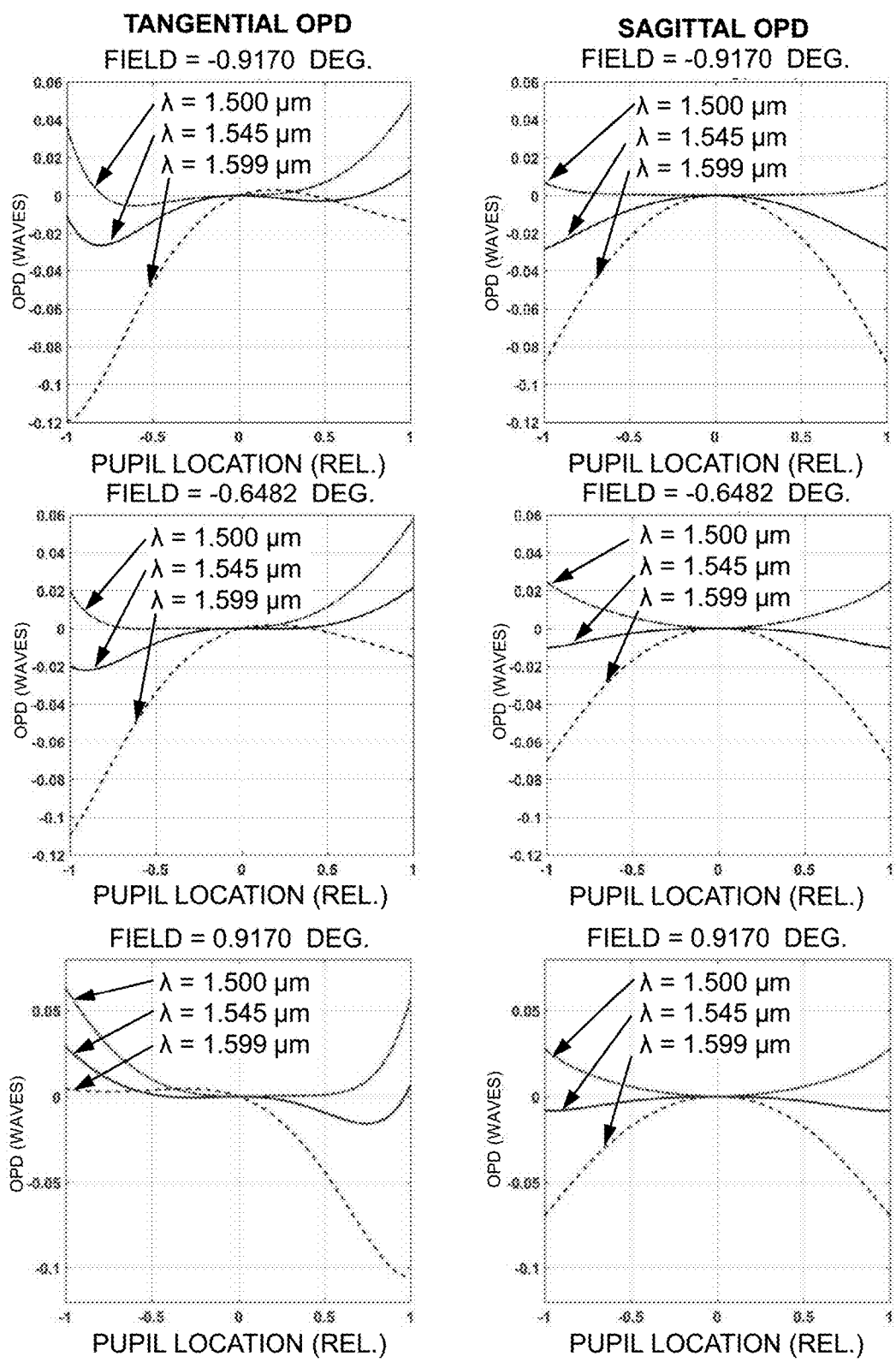
FIG. 9 shows lens optical path difference data for +18 degrees C. configured in accordance with an embodiment.

FIG. 9 shows lens optical path difference performance data 900 for +18 degrees C. Values are for tangential and sagittal OPD for fields of −0.9170, −0.6482 degrees, and +0.9170 degrees and wavelength values of 1.500, 1.545, and 1.599 microns at relative pupil locations of −1 to +1.

Figure 10:
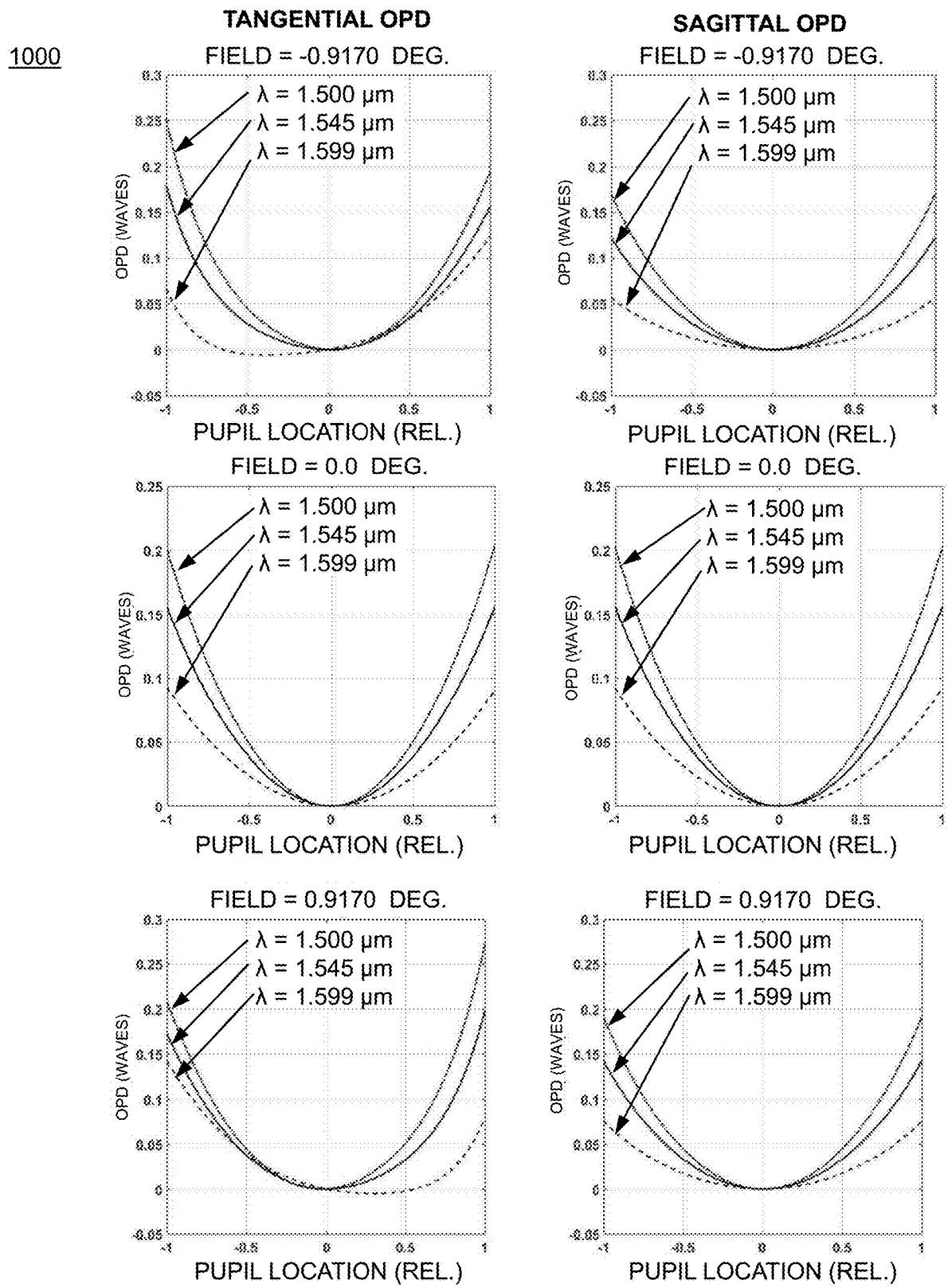
FIG. 10 shows lens optical path difference data for +65 degrees C. configured in accordance with an embodiment.

FIG. 10 shows lens optical path difference performance data 1000 for +65 degrees C. Values are for tangential and sagittal OPD for fields of −0.9170 degrees, 0.0 degrees, and +0.9170 degrees, wavelength values of 1.500, 1.545, and 1.599 microns at relative pupil locations of −1 to +1.

Figure 11:
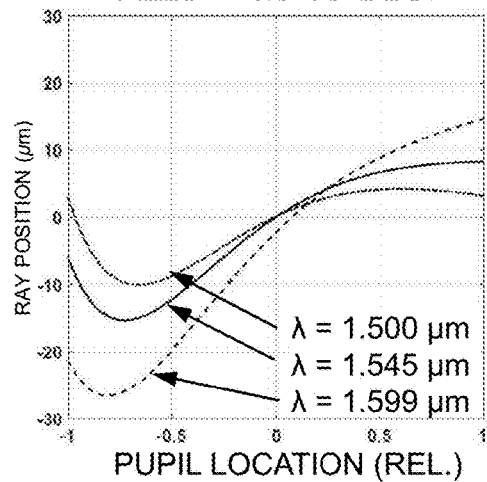
FIG. 11 shows lens ray data for −10 degrees C. configured in accordance with an embodiment.
Figure 11:
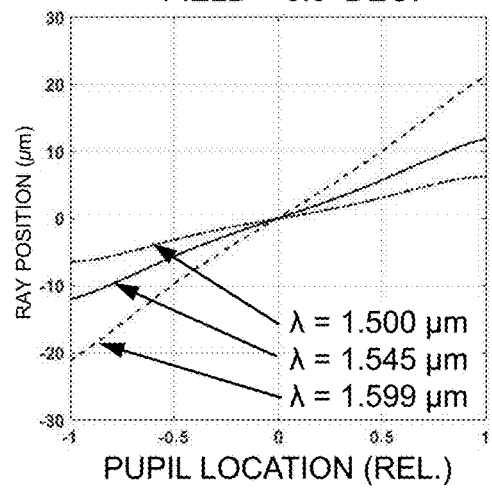
Figure 11:
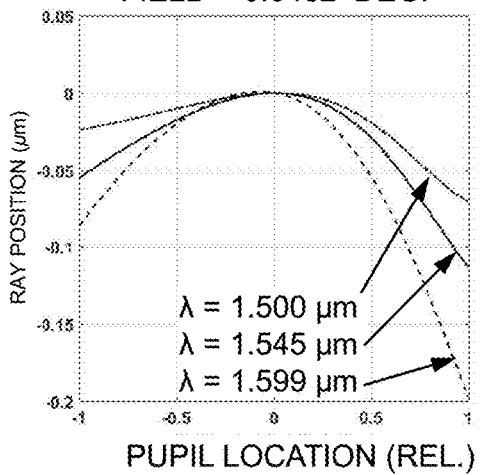
Figure 11:
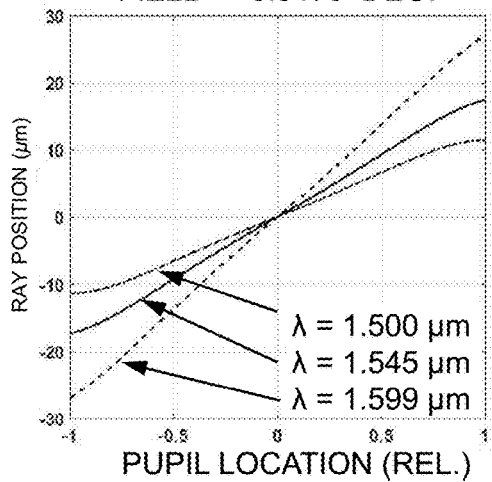
Figure 11:
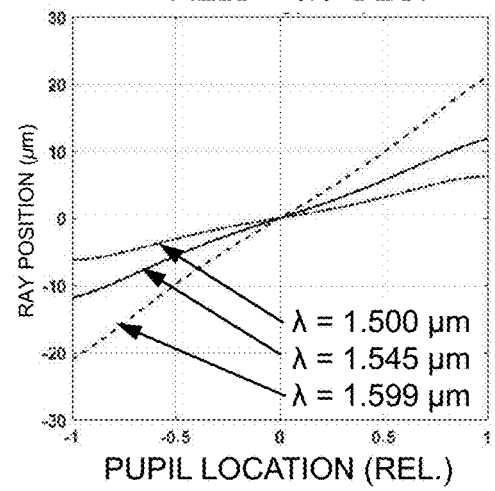
Figure 11:
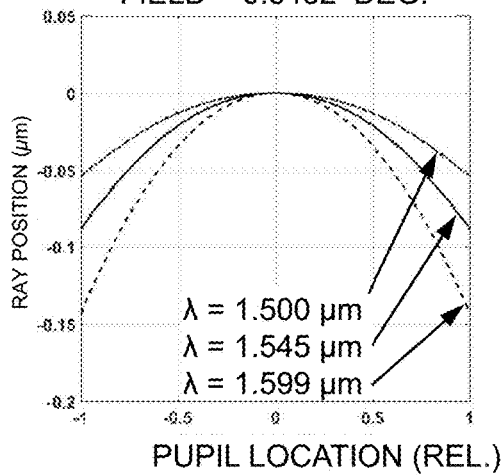

FIG. 11 shows lens ray performance data 1100 for −10 degrees C. Presented are tangential and sagittal ray diagrams for fields of −0.9170 degrees, −0.0 degrees, and +0.6482 degrees and wavelength values of 1.500, 1.545, and 1.599 microns at relative pupil locations of −1 to +1.

Figure 12:
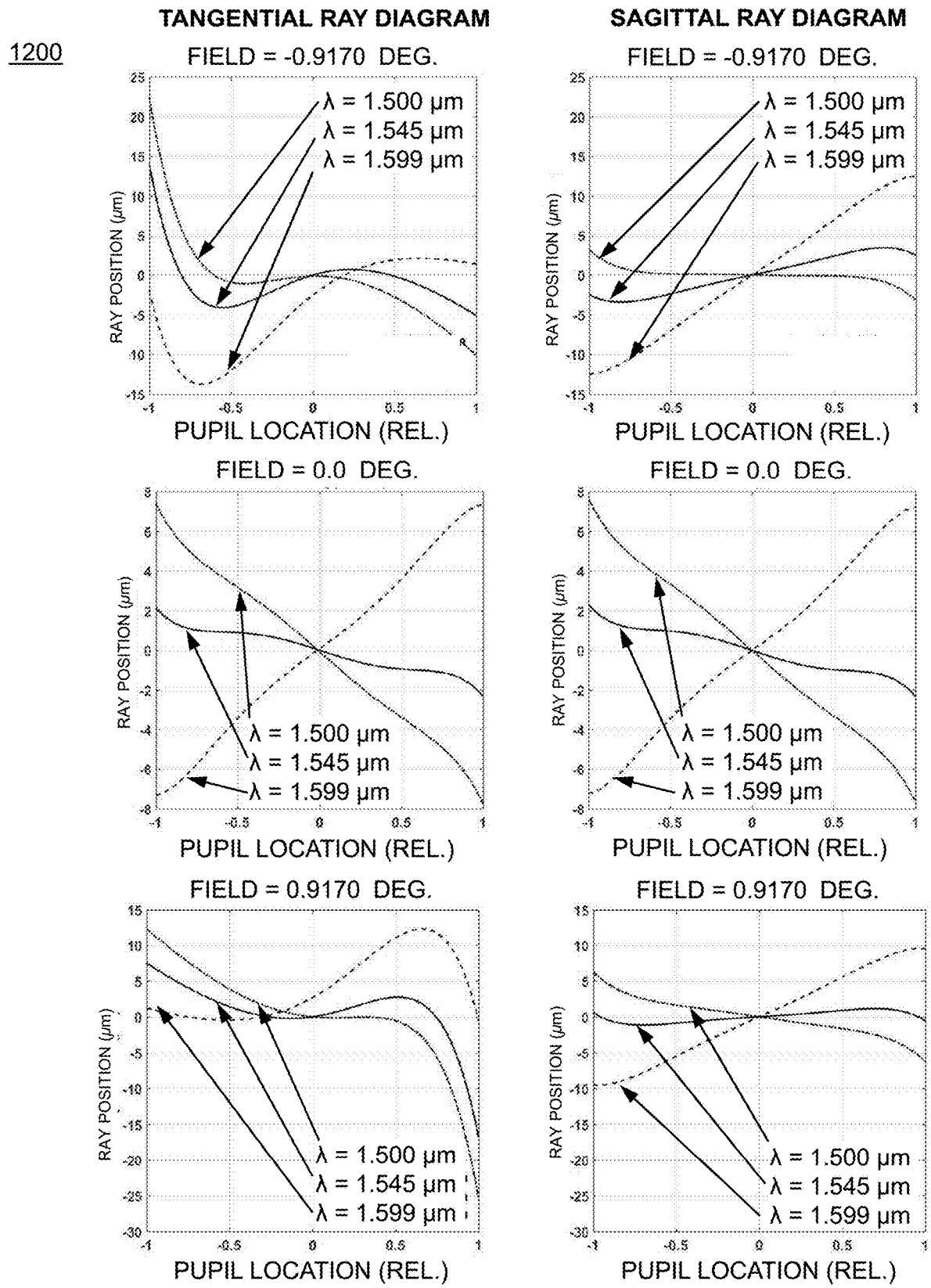
FIG. 12 shows lens ray data for +18 degrees C. configured in accordance with an embodiment.

FIG. 12 shows lens ray performance data 1200 for +18 degrees C. Presented are tangential and sagittal ray diagrams for fields of −0.9170 degrees, −0.0 degrees, and +0.9170 degrees and wavelength values of 1.500, 1.545, and 1.599 microns at relative pupil locations of −1 to +1.

Figure 13:
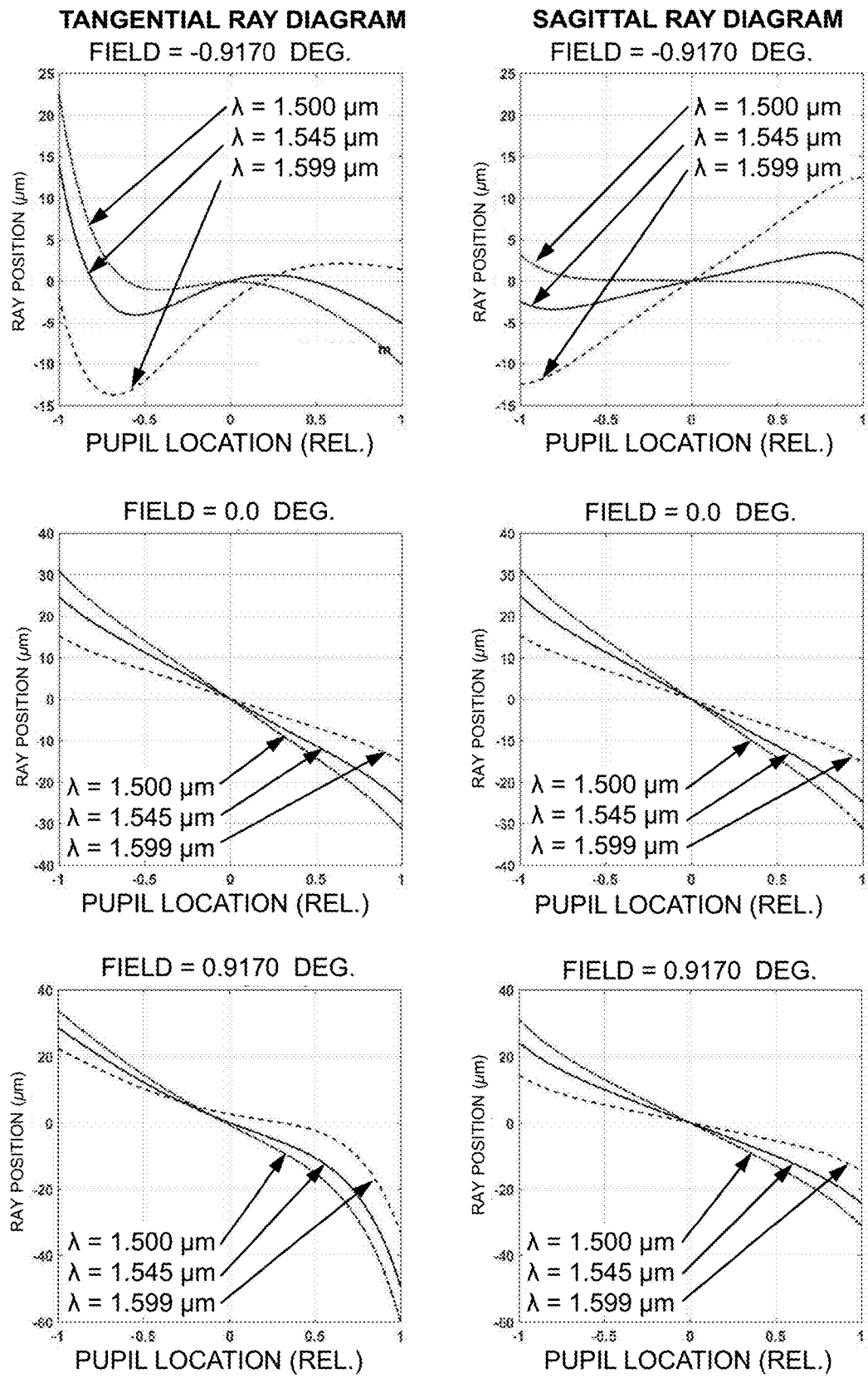
FIG. 13 shows lens ray data for +65 degrees C. configured in accordance with an embodiment.

FIG. 13 shows lens ray performance data 1300 for +65 degrees C. Presented are tangential and sagittal ray diagrams for fields of −0.9170 degrees, −0.0 degrees, and +0.9170 degrees and wavelength values of 1.500, 1.545, and 1.599 microns at relative pupil locations of −1 to +1.

FIGS. 14A-14K present the Zemax OpticStudio® lens prescription configured in accordance with an embodiment. OpticStudio® is a registered trademark of Zemax LLC.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. An athermalized Short-Wave InfraRed (SWIR) telephoto lens device for a tracking camera comprising, in order, from a remote object to an image plane:
   an Aperture Stop (AS);
   a first optical element having a first element first surface radius of 23.16 to 23.24 mm convex, and a first element second surface radius of 46.21 to 46.29 mm concave;
   a second optical element having a second element first surface radius of 22.68 to 22.76 mm convex, and a second element second surface radius of 46.21 to 46.29 mm concave; and
   a third optical element having a third element first surface radius of −56.81 to −56.89 mm concave, and a third element second surface radius of 16.61 to 16.69 mm concave; and
   a housing to hold at least said first, second, and third optical elements comprising a material having a Coefficient of Thermal Expansion (CTE) of about 8.8 ppm/K at room temperature;
   whereby an image is formed.

2. The SWIR lens device of claim 1 wherein said lens is corrected over a spectral waveband of 1.5 μm to 1.6 μm from −10 C to +65 C.

3. The SWIR lens device of claim 1 wherein a length from said first optical element to said camera is 88 mm.

4. The SWIR lens device of claim 1 wherein telephoto ratio is 0.367.

5. The SWIR lens device of claim 1 wherein a full Field Of View (FOV) is 3 degrees.

6. The SWIR lens device of claim 1 wherein an F# is 24.

7. The SWIR lens device of claim 1 wherein:
   the aperture stop is 8.50 inches from said first surface of said first optical element;
   said second surface of said first optical element is 0.850 inches from a reference point;
   said second surface of said second optical element is 0.3685 inches from said reference point; and
   said second surface of said third optical element is 0.090 inches from said reference point.

8. The SWIR lens device of claim 1, further comprising a window after said third optical element.

9. The SWIR lens device of claim 1, further comprising a flat window after said third optical element.

10. The SWIR lens device of claim 1, further comprising a wedged window after said third optical element.

11. The SWIR lens device of claim 9, wherein:
    a thickness of said first optical element is 6.4 mm;
    a thickness of said second optical element is 6.5 mm; and
    a thickness of said third optical element is 6.5 mm.

12. The SWIR lens device of claim 1, wherein a material of said first optical element is Zinc Sulfide.

13. The SWIR lens device of claim 1, wherein a material of said second optical element is Zinc Sulfide.

14. The SWIR lens device of claim 1, wherein a material of said third optical element is Silicon.

15. An athermalized Short-Wave InfraRed (SWIR) telephoto lens system comprising, in order, from a remote object to an image plane:
    an Aperture Stop (AS);
    a first optical element having a first element first surface radius of 23.20877 mm convex, and a first element second surface radius of 46.25187 mm concave;
    a second optical element having a second element first surface radius of 22.72226 mm convex, and a second element second surface radius of 45.57776 mm concave; and
    a third optical element having a third element first surface radius of −56.85377 mm concave, and a third element second surface radius of 16.65206 mm concave; and
    a housing to hold at least said first, second, and third optical elements comprising a material having a Coefficient of Thermal Expansion (CTE) of about 8.8 ppm/K at room temperature;
    whereby an image is formed.

16. The system of claim 15, wherein said lens system comprises a lens system of a tracking camera.

17. The system of claim 15, wherein said housing is comprised of titanium.

18. The system of claim 15, wherein said housing is comprised of a nickel alloy.

19. The system of claim 15, wherein said housing is comprised of stainless steel.

20. An athermalized Short-Wave InfraRed (SWIR) telephoto lens tracking camera comprising, in order, from a remote object to an image plane:
    an Aperture Stop (AS);
    a first optical element having a first element first surface radius of 23.20877 mm convex, and a first element second surface radius of 46.25187 mm concave;
    a second optical element having a second element first surface radius of 22.72226 mm convex, and a second element second surface radius of 45.57776 mm concave;
    a third optical element having a third element first surface radius of −56.85377 mm concave, and a third element second surface radius of 16.65206 mm concave;
    a wedged window;
    wherein said second surface of said first optical element is 0.850 inches from a reference point;
    wherein said second surface of said second optical element is 0.3685 inches from said reference point;
    wherein said second surface of said third optical element is 0.090 inches from said reference point;
    wherein said second surface of said first optical element is 0.850 inches from a reference point;
    wherein said second surface of said second optical element is 0.3685 inches from said reference point;

wherein said second surface of said third optical element is 0.090 inches from said reference point;
wherein a material of said first optical element is Zinc Sulfide;
wherein a material of said second optical element is Zinc Sulfide;
wherein a material of said third optical element is Optical Silicon;
a lens housing to hold at least said first, second, and third optical elements made of Titanium alloy Ti-6Al-4V having a Coefficient of Thermal Expansion (CTE) of about 8.8 ppm/K at room temperature;
wherein said lens is corrected over a spectral waveband of 1.5 μm to 1.6 μm from −10 C to +65 C, a length from said first element to said camera is 88 mm, a telephoto ratio is 0.367, an F# is 24, and a focal length is 240 mm.

* * * * *